United States Patent
Song et al.

(10) Patent No.: US 10,978,531 B2
(45) Date of Patent: Apr. 13, 2021

(54) TRANSPARENT DISPLAY SUBSTRATE, MANUFACTURING METHOD THEREOF AND TRANSPARENT DISPLAY PANEL

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/417,127

(22) Filed: May 20, 2019

(65) Prior Publication Data

US 2020/0075701 A1  Mar. 5, 2020

(30) Foreign Application Priority Data

Sep. 4, 2018 (CN) .......................... 201811027270.6

(51) Int. Cl.
 *H01L 27/32* (2006.01)
 *H01L 51/52* (2006.01)
 *H01L 51/56* (2006.01)

(52) U.S. Cl.
 CPC ........ *H01L 27/3262* (2013.01); *H01L 27/322* (2013.01); *H01L 51/5218* (2013.01); *H01L 51/5228* (2013.01); *H01L 51/5234* (2013.01); *H01L 51/5284* (2013.01); *H01L 51/56* (2013.01); *H01L 2227/323* (2013.01); *H01L 2251/5315* (2013.01)

(58) Field of Classification Search
 CPC ............. H01L 27/3262; H01L 51/5218; H01L 51/5228

USPC ............................................. 257/40; 438/149
See application file for complete search history.

(56) References Cited

U.S. PATENT DOCUMENTS

| 2005/0202601 A1* | 9/2005 | Koide ................. H01L 27/1259 438/149 |
| 2011/0163661 A1 | 7/2011 | Lee et al. |
| 2012/0168764 A1 | 7/2012 | Kim |

(Continued)

FOREIGN PATENT DOCUMENTS

| CN | 101051626 A | 10/2007 |
| CN | 102117825 A | 7/2011 |

(Continued)

OTHER PUBLICATIONS

Chinese Office Action in Chinese Application No. 201811027270.6, dated Apr. 3, 2020 with English translation.

*Primary Examiner* — David Vu
*Assistant Examiner* — Brandon C Fox
(74) *Attorney, Agent, or Firm* — Collard & Roe, P.C.

(57) ABSTRACT

A transparent display substrate, a manufacturing method thereof and a transparent display panel are provided. The transparent display substrate includes: a base substrate; a plurality of sub-pixels arranged on the substrate, wherein each of the plurality of sub-pixels comprising a light emitting region and a first transparent region, and the light emitting region being provided with an organic light emitting diode (OLED); a driving circuit, located in each of the plurality of sub-pixels and configured to drive the OLED to emit light, the driving circuit comprising a capacitor disposed in the first transparent region.

17 Claims, 5 Drawing Sheets

(56) References Cited

U.S. PATENT DOCUMENTS

| | | | | |
|---|---|---|---|---|
| 2015/0097172 A1* | 4/2015 | Han | ............... | G02F 1/136213 |
| | | | | 257/40 |
| 2015/0102294 A1* | 4/2015 | Choi | ............... | H01L 27/3248 |
| | | | | 257/40 |
| 2015/0187854 A1* | 7/2015 | Beak | ............... | H01L 27/3262 |
| | | | | 257/40 |
| 2015/0214249 A1 | 7/2015 | Cheng et al. | | |
| 2016/0202400 A1* | 7/2016 | Lee | ............... | G02B 5/206 |
| | | | | 257/40 |
| 2017/0148861 A1* | 5/2017 | Kim | ............... | H01L 27/3265 |
| 2018/0219032 A1 | 8/2018 | Lou et al. | | |
| 2019/0206977 A1* | 7/2019 | Lee | ............... | H01L 27/3258 |
| 2020/0106039 A1 | 4/2020 | Li et al. | | |

FOREIGN PATENT DOCUMENTS

| CN | 102593146 A | 7/2012 |
|---|---|---|
| CN | 103208506 A | 7/2013 |
| CN | 104517996 A | 4/2015 |
| CN | 106783911 A | 5/2017 |
| CN | 107452757 A | 12/2017 |
| CN | 107808895 A | 3/2018 |
| CN | 108461527 A | 8/2018 |

* cited by examiner

TRANSPARENT DISPLAY SUBSTRATE, MANUFACTURING METHOD THEREOF AND TRANSPARENT DISPLAY PANEL

CROSS REFERENCE TO RELATED APPLICATIONS

The present application is based on and claims the priority of Chinese patent application No. 201811027270.6 entitled "transparent display substrate and transparent display panel", filed on Sep. 4, 2018, the disclosure of which is incorporated herein by reference in its entirety as a part of this application.

TECHNICAL FIELD

Embodiments of the disclosure relate to a transparent display substrate, a manufacturing method thereof, and a transparent display panel.

BACKGROUND

In daily life, display devices include Liquid Crystal Display (LCD) devices that are developing to ultra-high resolution, small and medium-sized Organic Light-Emitting Diode (OLED) devices that have been widely used in portable devices, such as mobile phones and tablet computers (Pad), and large-sized OLED display devices that are increasingly mature for Television (TV).

SUMMARY

Embodiments of the disclosure provide a transparent display substrate, a manufacturing method thereof, and a transparent display panel.

At least an embodiment of the present disclosure provides a transparent display substrate, comprising:
 a base substrate;
 a plurality of sub-pixels, arranged on the substrate, each of the plurality of sub-pixels comprising a light emitting region and a first transparent region, and the light emitting region being provided with an organic light emitting diode (OLED); and
 a driving circuit, located in each of the plurality of sub-pixels and configured to drive the OLED to emit light, the driving circuit comprising a capacitor disposed in the first transparent region.

At least another embodiment of the present disclosure provides a transparent display panel including the transparent display substrate described above.

At least another embodiment of the present disclosure provides a method for manufacturing a transparent display substrate, comprising:
 providing a base substrate;
 forming a plurality of sub-pixels on the substrate, each of the plurality of sub-pixel comprising a light emitting region and a first transparent region, and an organic light emitting diode (OLED) being formed in the light emitting region; and
 forming a driving circuit in each of the plurality of sub-pixels, the driving circuit being configured to drive the OLED to emit light and comprising a capacitor formed in the first transparent region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 5b is a schematic cross-sectional view of AA' in FIG. 5a;

FIG. 5c is a schematic cross-sectional view of BB' in FIG. 5a;

FIG. 5d is a schematic cross-sectional view of CC' in FIG. 5a;

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least an embodiment of the present disclosure provides a transparent display substrate, comprising: a base substrate; a plurality of sub-pixels, arranged on the substrate, each of the plurality of sub-pixels comprising a light emitting region and a first transparent region, and the light emitting region being provided with an organic light emitting diode (OLED); and a driving circuit, located in each of the plurality of sub-pixels and configured to drive the OLED to emit light, the driving circuit comprising a capacitor disposed in the first transparent region.

In at least an embodiment of the present disclosure, the capacitor for driving the OLED to emit light is arranged in the first transparent region, which increases the proportion of the transparent region in the entire display substrate compared with arranging the capacitor in the light emitting region.

Figure 1:
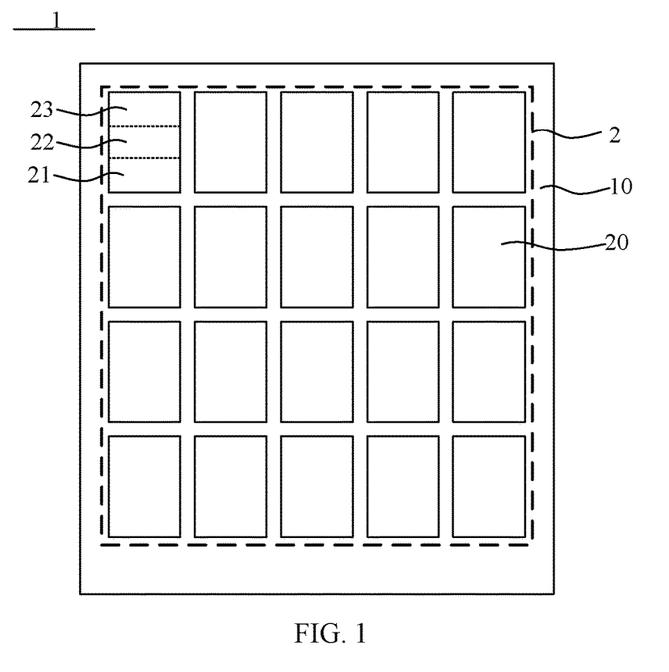
FIG. 1 is a schematic plan view of a transparent display substrate according to at least an embodiment of the present disclosure.

At least an embodiment of the present disclosure provides a transparent display substrate 1, as illustrated in FIG. 1, the transparent display substrate 1 comprises a base substrate 10 and a plurality of sub-pixels 20 disposed on the substrate 10 and located in a display region 2.

Figure 2:
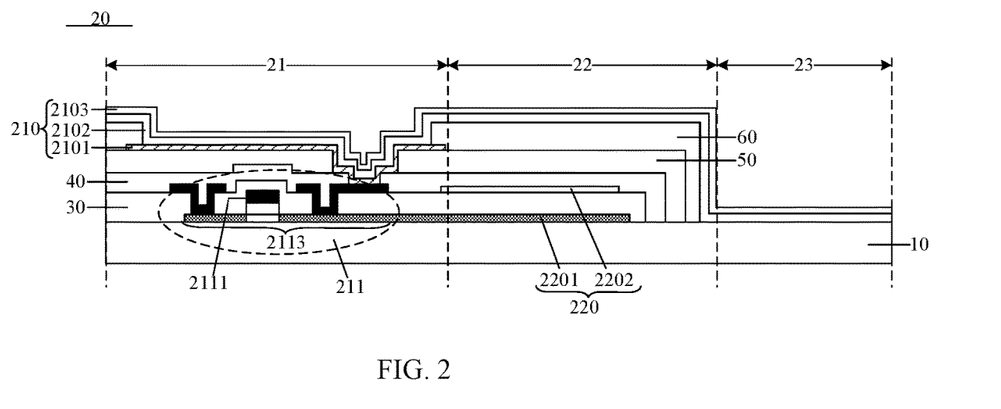
FIG. 2 is a schematic cross-sectional view of a sub-pixel according to at least an embodiment of the present disclosure.

As illustrated in FIG. 1 and FIG. 2, each sub-pixel 20 includes a light emitting region 21 and a first transparent region 22. As illustrated in FIG. 2, the light emitting region 21 is provided with a top-emissive OLED 210 and a Thin Film Transistor (TFT) driving circuit. The first transparent region 22 is provided with a capacitor 220. The TFT driving circuit and the capacitor 220 constitute a driving circuit for driving the OLED 210 to emit light.

Figure 3:
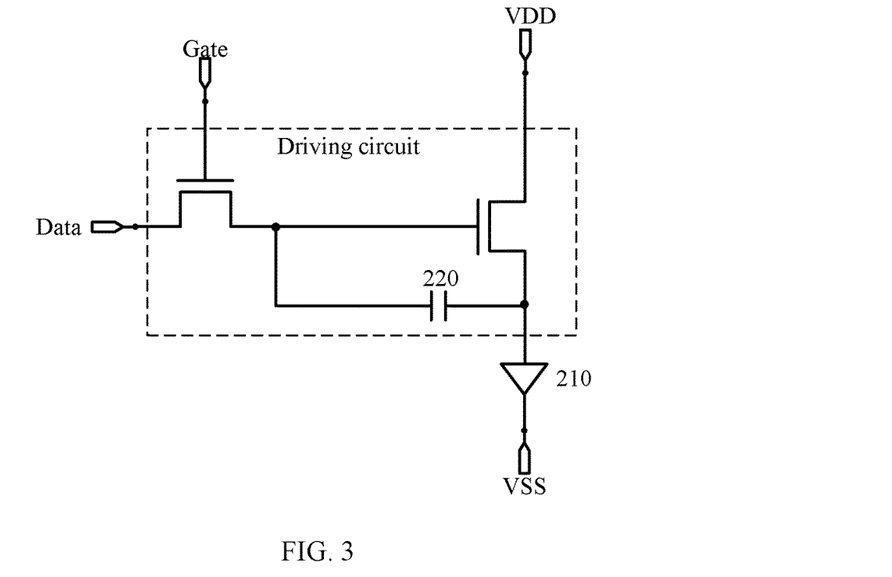
FIG. 3 is an equivalent circuit diagram of a driving circuit according to at least an embodiment of the present disclosure.

For example, the driving circuit for driving OLED 210 to emit light is 2T1C, and the equivalent circuit diagram of the driving circuit and OLED 210 is illustrated in FIG. 3.

Normally, the driving circuit for driving the OLED 210 to emit light, which is composed of the capacitor 220 and the TFT driving circuit, is all disposed on the side of the top-emitting OLED 210 close to the base substrate 10, that is, in the light emitting region 21. In this way, when a conventional transparent display substrate is applied to a transparent display panel, there is a problem that the capacitance 220 is covered by the reflective anode of the OLED 210, so that the transparent area occupies a relatively small area.

In the embodiment of the present disclosure, the capacitor 220 of the driving circuit is disposed in the first transparent region 22, and other circuits in the driving circuit except the capacitor 220 are disposed in the light emitting region 21; for example, a TFT driving circuit formed by connecting all two TFTs, are disposed in the light emitting region 21.

Those skilled in the art will understand that, in order to drive the OLED 210 to emit light, the capacitor 220 is electrically connected to the TFT driving circuit regardless of the arrangement of the capacitor 220 and the TFT driving circuit in the driving circuit.

The embodiment of the present disclosure is not limited to the driving circuit, and the driving circuit may include two TFTs or more than two TFTs.

For the first transparent region 22, it is called "transparent region" because each film layer disposed in the region is a transparent film layer. That is, the first transparent region 22 is entirely light-transmissive, and it presents transparent characterization.

Based on this, for the capacitor 220 disposed in the first transparent region 22, it can be understood that the material made of both electrodes of the capacitor 220 are transparent material.

In the transparent display substrate 1 provided by the embodiment of the present disclosure, the capacitor 220 and the TFT driving circuit of the driving circuit for driving the OLED 210 to emit light are respectively arranged in two regions, and the region where the capacitor 220 is located is transparent, i.e., the capacitor 220 is arranged in the first transparent region 22. In this way, when the transparent display substrate 1 is applied to a transparent display panel, the proportion of the transparent region can be increased without affecting the display, so that the transparency of the transparent display panel can be increased.

Optionally, as illustrated in FIG. 1 and FIG. 2, each sub-pixel 20 further includes a second transparent region 23 disposed on the side of the first transparent region 22 away from the light emitting region 21. For example, the second transparent region 23 is disposed on a side of the first transparent region 22 opposite to the light emitting region 21. For example, a sum of thicknesses of all film layers located on the substrate 10 in the second transparent region 23 is smaller than a sum of thicknesses of all film layers located on the substrate 10 in the first transparent region 22.

For the second transparent region 23, it is called "transparent region" because each film layer disposed in the region is a transparent film layer. That is, the second transparent region 23 is entirely light-transmissive, and it presents transparent characterization.

After the transparent display substrate 1 is fabricated, the sum of the thicknesses of all the film layers formed on the substrate 10 in the second transparent region 23 is smaller than the sum of the thicknesses of all the film layers formed on the substrate 10 in the first transparent region 22.

Since the function of the second transparent region 23 in the transparent display substrate 1 is to provide a transparent region for the transparent display substrate, so that the proportion of the transparent region in the transparent display substrate 1 is increased. When the sum of the thicknesses of all the film layers formed in the second transparent region 23 is small, the transparency of the second transparent region 23 can be further increased, thereby increasing the transparency of the transparent display panel.

Optionally, as illustrated in FIG. 2, OLED 210 includes a reflective anode 2101, an organic material functional layer 2102, and a transparent cathode 2103. The organic material functional layer 2102 and the transparent cathode 2103 each covers the display region 2, that is, covers each sub-pixel. For example, in the second transparent region 23, the organic material functional layer 2102 is in direct contact with the base substrate 10.

For example, the organic material functional layer 2102 may include a light emitting layer, a hole transporting layer, an electron transporting layer, and the like. Further, for example, the organic material functional layer 2102 may further include a hole injection layer, an electron injection layer, and the like.

For example, when the light-emitting layer in the organic material functional layer 2102 is a white light-emitting layer, the organic material functional layer 2102 can be formed by vapor deposition through an Open Mask, so that the organic material functional layer 2102 is formed in the entire display region 2 of the transparent display substrate 1.

Of course, the transparent cathode 2103 is also located in the entire display area 2.

It should be noted that, in the second transparent region 23, the organic material functional layer 2102 is in direct contact with the substrate 10, that is, there is no other film layer between the organic material functional layer 2102 and the substrate 10 in the second transparent region 23. In the embodiment of the present disclosure, by directly contacting the organic material functional layer 2102 with the base substrate 10 in the second transparent region 23, the sum of the thicknesses of all the film layers in the second transparent region 23 on the transparent display substrate 1 can be made smaller, thereby increasing the transparency of the second transparent region 23.

Figure 4:
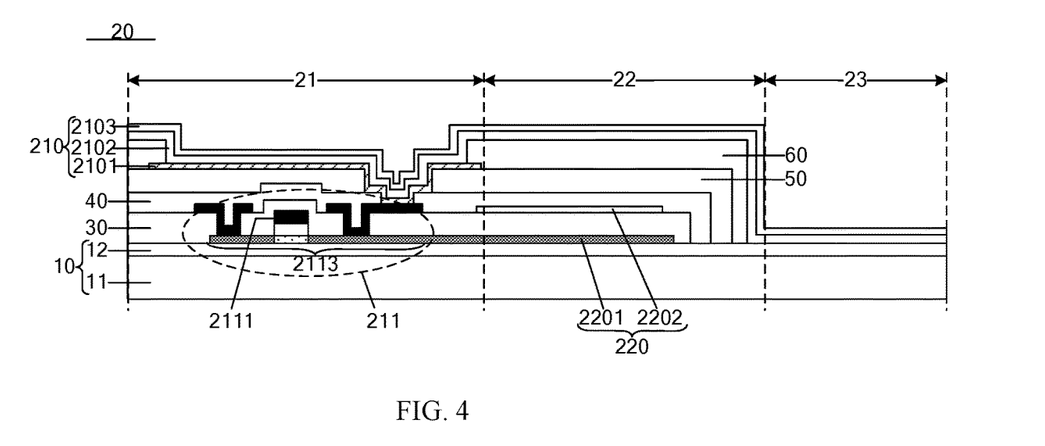
FIG. 4 is a schematic cross-sectional view of another sub-pixel provided by at least an embodiment of the present disclosure.

Optionally, as illustrated in FIG. 4, the base substrate 10 includes a substrate body 11 and a buffer layer 12 disposed on the substrate body 11. For example, the buffer layer is located in each of the light emitting region, the second transparent region, and the second region of the sub-pixel. The substrate body 11 may be a flexible substrate body or a rigid substrate body, such as a glass substrate body. For example, in the case where the sub-pixel 20 includes the second transparent region 23, the organic material functional layer 2102 is in direct contact with the buffer layer 12 in the second transparent region 23. For example, after forming the buffer layer 12 and before forming the organic material functional layer 2102, all the insulating layers in the second transparent region 23 are etched away, so that the organic material functional layer 2102 is in direct contact with the buffer layer 12.

FIG. 4 is taken as an example. After forming the buffer layer 12 and before forming the organic material functional layer 2102, an interlayer insulating layer 30, a passivation layer 40, an organic planarization layer 50 and a pixel defining layer 60 are formed. Based on this, by etching away the interlayer insulating layer 30, the passivation layer 40, the organic planarization layer 50, and the pixel defining layer 60 in the second transparent region 23, the organic material functional layer 2102 can be brought into direct contact with the buffer layer 12.

In the embodiment of the present disclosure, by providing the buffer layer 12 on the substrate body 11 and leaving the buffer layer 12 in the second transparent region 23, the purpose of protecting the substrate body 11 can be achieved to prevent the substrate body 11 from etching damage.

Figure 5A:
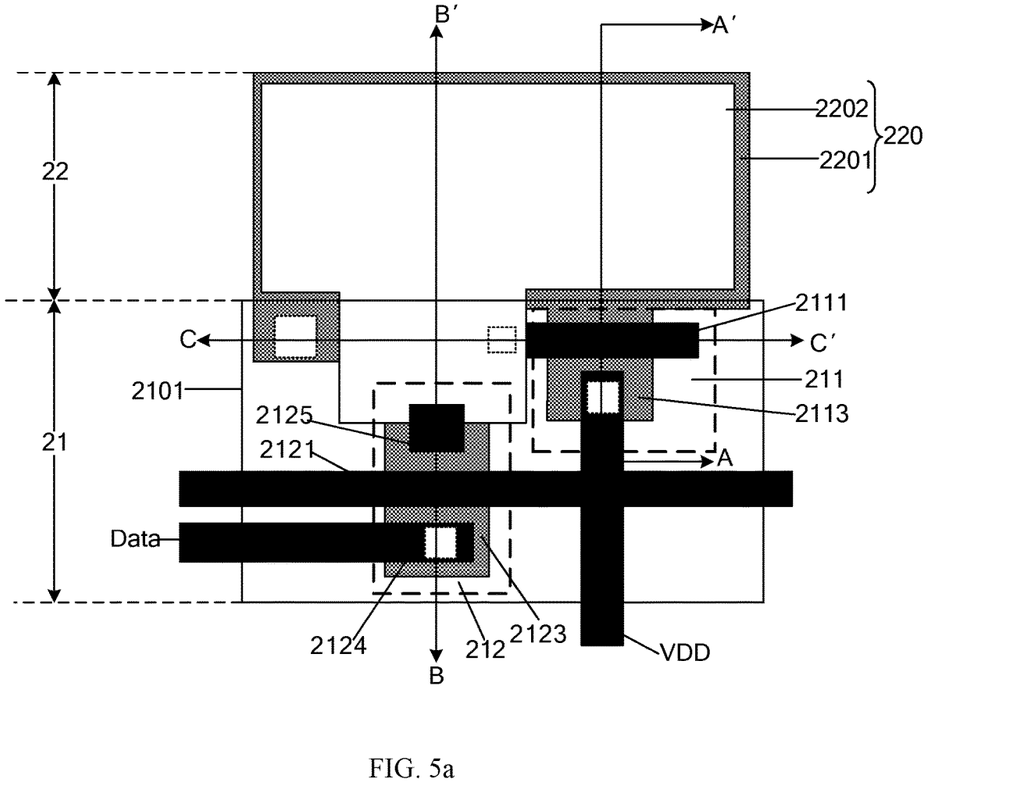
FIG. 5a is a schematic plan view of a sub-pixel according to at least an embodiment of the present disclosure.

Optionally, the TFT driving circuit includes a driving TFT and at least one switching TFT, both of which are located in the light emitting region. As illustrated in FIG. 5a, the driving TFT 211 includes a first gate electrode 2111 and a first active layer 2113. For example, the first active layer 2113 further extends to the first transparent region 22 so as to serve as the first electrode 2201 of the capacitor 220. For example, the second electrode 2202 of the capacitor 220 is a transparent electrode, and the second electrode 2202 is electrically connected to the first gate electrode 2111.

For example, except the part of the first active layer in the region which is directly opposite to the first gate electrode 2111 is semiconductor, the remaining parts of the first active layer 2113 are conductors. Here, the region of the first active layer 2113 which is directly opposite to the first gate electrode 2111 is also the overlapping region where the orthographic projection of the first active layer 2113 on the substrate 10 overlaps with the orthographic projection of the first gate electrode 2111 on the substrate 10, and the overlapping region is considered as the channel region of the driving TFT 211.

In the embodiment of the present disclosure, the driving TFT 211 may be a top-gate type TFT or a bottom-gate type TFT. The bottom gate type may be classified into a Back Channel Etch (BCE) structure and an Etch Stop Layer (ESL).

For example, the material of the first active layer 2113 is selected from the group consisting of amorphous indium gallium zinc oxide (a-IGZO), zinc oxynitride (ZnON), indium zinc tin oxide (IZTO), amorphous silicon (a-Si), polysilicon (p-Si), sexithiophene, polythiophene, and combination thereof and the like.

In the embodiment of the present disclosure, by extending the first active layer 2113 for driving the TFT 211 to the first transparent region 22, the first electrode 2201 of the capacitor 220 can be formed while the channel region of the driving TFT 211 is formed, thereby simplifying the manufacturing process and increasing the integration level.

Alternatively, as illustrated in FIG. 5a, FIG. 5b, FIG. 5c, and FIG. 5d, the at least one switching TFT includes a first switching TFT 212. The first switching TFT 212 includes a second gate electrode 2121, a second active layer 2123, a second source electrode 2124, and a second drain electrode 2125. For example, the second active layer 2123 is disposed in the same layer as the first active layer 2113. For example, the second source electrode 2124 is electrically connected to the data line DATA, and the second drain electrode 2125 is electrically connected to the second electrode 2202.

Based on this, the equivalent circuit diagram of the driving circuit composed of one switching TFT 212, one driving TFT 211, and the capacitor 220 is illustrated in FIG. 3.

In order to reduce the contact resistance between the second source electrode 2124 and the second active layer 2123 and the contact resistance between the second drain electrode 2125 and the second active layer 2123, in some embodiments, except the part of the second active layer 2123 in the region which is directly opposite to the first gate electrode 2111 is semiconductor, the remaining parts of the second active layer 2123 are conductors. Here, the region of the second active layer 2123 which is directly opposite to the first gate electrode 2111 is also the overlapping region where the orthographic projection of the second active layer 2123 on the substrate 10 overlaps with the orthographic projection of the first gate electrode 2111 on the substrate 10, and the overlapping region is considered as the channel region of the driving TFT 212.

It should be noted that other structures of the first switching TFT 212 is similar to those of the driving TFT 211. Please refer to the description of the driving TFT 211 in detail and will not be repeated here.

In FIG. 5a, the gate line and the second gate electrode 2121 are integral structure, but the embodiment of the present disclosure is not limited to this. The gate line and the second gate electrode 2121 may be provided separately, or only the gate line may be provided, so that the gate line also serves as the second gate electrode 2121.

Figure 5B:
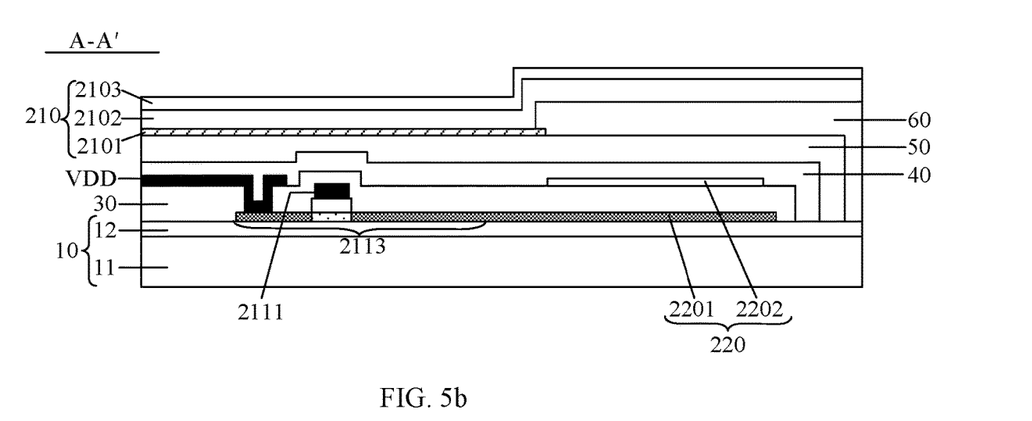
Figure 5C:
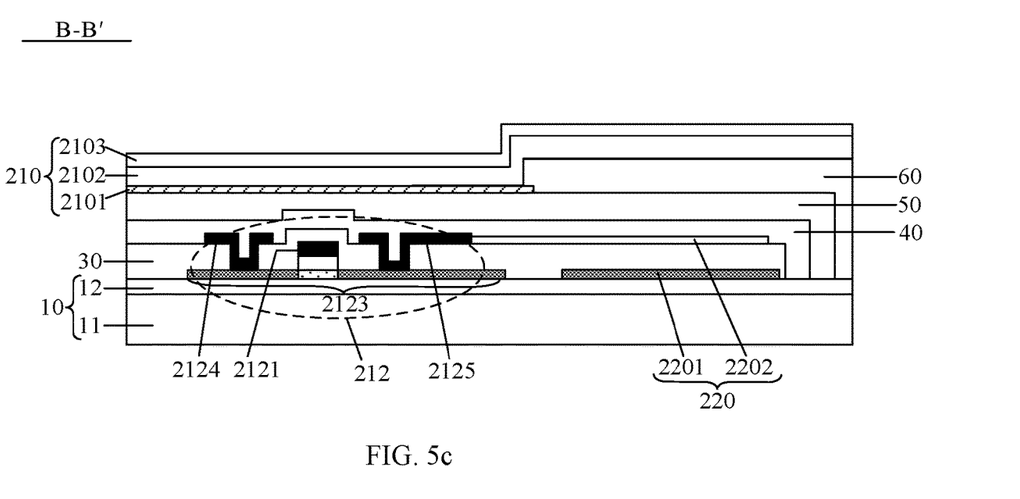

Alternatively, as illustrated in FIG. 5a and FIG. 5b, the driving TFT 211 is a top gate TFT; in the first transparent region 22, the two electrodes of the capacitor 220 (i.e., the first electrode 2201 and the second electrode 2202) are isolated from each other by an interlayer insulating layer 30.

According to the parallel plate capacitance formula, the capacitance of the capacitor 220 is inversely proportional to the distance between the two electrodes constituting the capacitor 220. By only providing the interlayer insulating layer 30 between the two electrodes of the capacitor 220, the capacitance of the capacitor 220 may meet the demand.

Figure 5D:
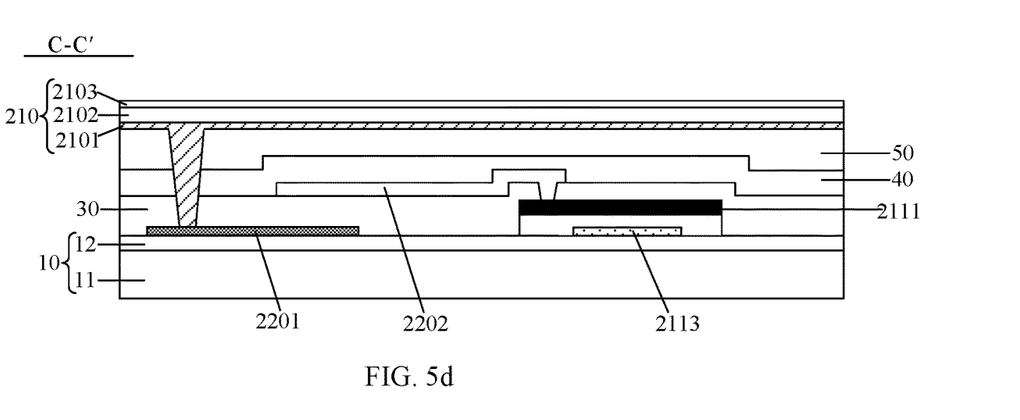

Considering that the first active layer 2113 is a conductor except for the channel region, in order to simplify the process, as illustrated in FIG. 5a and FIG. 5d, the anode 2101 of the OLED 210 and the portion of the first active layer 2113 serving as the first electrode 2201 can be electrically connected with each other through a via hole, in this way, when the driving TFT 2111 is fabricated, there is no need to form a drain electrode.

In addition, as illustrated in FIG. 5a and FIG. 5b, the power supply line VDD may be directly electrically connected to the first active layer 2113.

The embodiment of the disclosure further provides a method for manufacturing a transparent display substrate, the method comprises: providing a base substrate; forming a plurality of sub-pixels on the base substrate, wherein each of the plurality of sub-pixels comprises a light emitting region and a first transparent region, and an organic light emitting diode (OLED) being formed in the light emitting region; and forming a driving circuit in each of the plurality of sub-pixels, the driving circuit being configured to drive the OLED to emit light and comprising a capacitor formed in the first transparent region.

In the embodiment of the present disclosure, the capacitor for driving the OLED to emit light is arranged in the first transparent region, and compared with arranging the capacitor in the light emitting region, the proportion of the transparent region in the entire display substrate is increased.

Optionally, each of the plurality of sub-pixels further includes a second transparent region disposed on a side of the first transparent region away from the light emitting region, the first transparent region is configured to space apart the light emitting region and the second transparent region from each other.

Optionally, the forming the driving circuit in each of the plurality of sub-pixels further includes: forming a driving thin film transistor (TFT) in a light emitting region of each of the plurality of sub-pixels, wherein the driving TFT includes a first active layer, the capacitor includes a first electrode, the first active layer is located in the light emitting region and is configured to extend to the first transparent region, and the first active layer is further configured to serve as the first electrode of the capacitor after the first active layer being electrically conductive.

Optionally, the driving TFT further includes a first gate electrode, the capacitor further includes a second electrode, the second electrode of the capacitor is a transparent electrode, and the second electrode is electrically connected with the first gate electrode.

Optionally, the forming the driving circuit in each of the plurality of sub-pixels further includes: forming a switching TFT in a light emitting region in each of the plurality of sub-pixels, the switching TFT including a second gate electrode, a second active layer, a second source electrode, and a second drain electrode, the second drain electrode is electrically connected to the second electrode of the capacitor.

Optionally, in the first transparent region, a first electrode and a second electrode of the capacitor are isolated from each other by an interlayer insulating layer.

Optionally, the OLED includes a reflective anode, an organic material functional layer, and a transparent cathode; the organic material functional layer and the transparent cathode cover the entire area of each of the plurality of sub-pixels, and in the second transparent area, the organic material functional layer is in direct contact with the base substrate.

For example, the sub-pixel 20 includes the light emitting region 21, the first transparent region 22, and the second transparent region 23, referring to FIG. 5a to FIG. 5d, a method for manufacturing the transparent display substrate 1 is provided. It should be noted that the second transparent region 23 is not illustrated in FIG. 5a to FIG. 5d.

For example, the method includes:

S10: Cleansing the substrate body 11, and depositing a buffer layer 12 on the substrate body 11; after that, a semiconductor material is deposited and patterned to form an active layer including a first active layer 2113 and a second active layer 2123, the first active layer 2113 is located in the light emitting region 21 and extended to the first transparent region 22, and the second active layer 2123 is located in the light emitting region 21.

S11: continuously depositing a gate insulating material and a metal material, and forming a gate insulating layer and a gate metal layer through a self-aligned process, herein, the gate metal layer comprises a first gate electrode 2111 and a second gate electrode 2121, both of which are positioned in the light emitting region 21, the first gate electrode 2111 is positioned above the first active layer 2113, and the second gate electrode 2121 is positioned above the second active layer 2123; the semiconductor material of the first active layer 2113 other than its channel region and the semiconductor material of the second active layer 2123 other than its channel region are processed by dry etching plasma to complete the conductor formation, that is, to make the semiconductor become electrical conductor.

For example, after the first active layer 2113 is made electrically conductive, the conductive portion of the first active layer in the first transparent region 22 serves as a first electrode 2201 of a capacitor 220.

S12: depositing and etching the interlayer insulating layer 30 to form a via hole for electrical connection, and etching away the interlayer insulating layer 30 in the second transparent region 23.

S13: depositing a transparent conductive material (e.g., indium tin oxide) and forming a second electrode 2202 in the first transparent region 22. The second electrode 2202 is electrically connected to the first gate electrode 2111 through the via hole of the interlayer insulating layer 30.

S14: depositing and patterning a metal material to form a source-drain metal layer, wherein the source-drain metal layer comprises a second source electrode 2124 and a second drain electrode 2125; the second drain electrode 2125 is electrically connected to the second electrode 2202.

S15: forming a passivation layer 40 by deposition method, etching the passivation layer 40 to form a via hole for electrical connection, and etching away the passivation layer 40 in second transparent region 23.

S16: coating an organic planarization material (e.g., resin material) to form an organic planarization layer 50, etching the organic planarization layer 50 to form a via for electrical connection, and etching away the organic planarization layer 50 in the second transparent region 23.

S17: depositing a reflective anode material (e.g., ITO/Ag/ITO), and forming a reflective anode 2101 of the OLED 210 in the light emitting region 21 after the reflective anode material is patterned.

S18: coating a pixel defining layer (PDL) material, so that the second transparent region 23 is free of PDL material.

S19: evaporating the organic material functional layer 2102, and finally depositing the transparent cathode 2103.

For example, the metal electrode involved in the TFT of the transparent display substrate 1 may be made of at least one of silver (Ag), copper (Cu), aluminum (Al), molybdenum (Mo), or the like. Alternatively, the metal electrode may be made of an alloy material, such as at least one of aluminum neodymium (AlNd), molybdenum niobium (MoNb), or the like. The structure of the metal electrode may be a multi-layer metal structure, such as MoNb/Cu/MoNb, etc. In addition, the structure of the metal electrode may also be a stack structure formed by metal and transparent conductive oxide (such as ITO, AZO, etc.), such as Mo/AlNd/ITO, ITO/Ag/ITO, etc.

For example, the material of the buffer layer 12, the gate insulating layer, the interlayer insulating layer 30, and the passivation layer 40 includes, but are not limited to, a dielectric material, such as silicon oxide (SiOx), silicon nitride (SiNx), silicon oxynitride (SiON), or various novel organic insulating materials, or high dielectric constant (High k) materials, such as aluminum oxide (AlOx), hafnium oxide (HfOx), tantalum oxide (TaOx), and the like. For example, the material of the organic planarization layer 50 includes, but is not limited to, polysiloxane-based, acrylic-based or polyimide-based materials.

At least an embodiment of the present disclosure further provides a transparent display panel including the transparent display substrate 1 described above. The transparent display panel has the same beneficial effects as the transparent display substrate 1, and will not be described here again.

Figure 6:
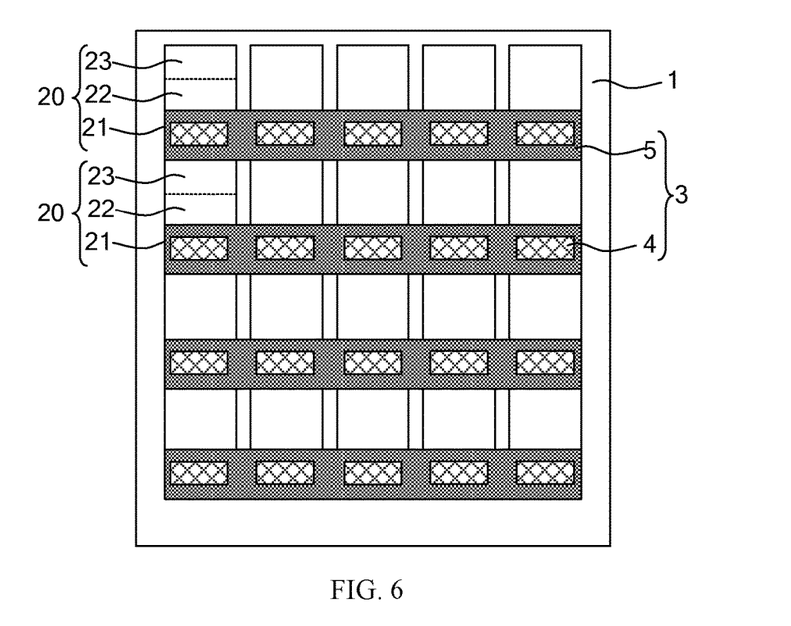
FIG. 6 is a schematic plan view of a transparent display panel according to at least an embodiment of the present disclosure.
Figure 7:
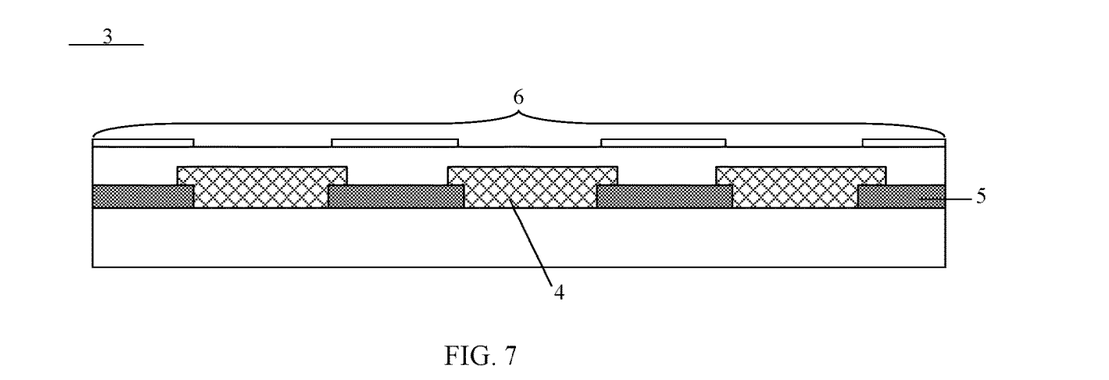
FIG. 7 is a schematic cross-sectional view of a cover plate according to at least an embodiment of the present disclosure.

Alternatively, as illustrated in FIG. 6 and FIG. 7, the transparent display panel further includes an opposed substrate disposed opposite to the transparent display substrate, such as a cover plate 3. For example, the cover plate 3 includes a color filter layer 4 and a black matrix 5. As illustrated in FIG. 6, the color filter layer 4 and the black matrix 5 are disposed in regions corresponding to the light emitting regions 21 on the transparent display substrate 1. That is, the orthographic projections of the color filter layer 4 and the black matrix 5 on the transparent display substrate 1 are within the light emitting regions 21.

The color filter layer 4 includes three primary color filter patterns of a first primary color filter pattern, a second primary color filter pattern, and a third primary color filter pattern. For example, each first primary color filter pattern, each second primary color filter pattern, and each third primary color filter pattern are respectively located in one sub-pixel 20.

The transparent display panel may be used for large-size displays by forming the color filter layer 4 and the black matrix 5 on the cover plate 3, wherein the color filter layer 4 and the black matrix 5 are arranged in regions corresponding to the light emitting regions 21 on the transparent display substrate 1 to ensure the transparency of the first transparent region 21 and the second transparent region 22, thereby increasing the proportion of transparent regions in the transparent display panel.

Optionally, as illustrated in FIG. 7, the cover plate 3 further includes an auxiliary cathode 6 electrically connected to the transparent cathode 2103 on the transparent display substrate 1. On this basis, the orthographic projection of the auxiliary cathode 6 on the substrate 10 completely overlaps the orthographic projection of the black matrix 5 on the substrate 10, which can avoid lowering the aperture ratio.

The material of the auxiliary cathode 6 is a metal material. The shape of the auxiliary cathode 6 may be the same as that of the black matrix 5, that is, the shape of the auxiliary cathode 6 is a grid shape.

By arranging the auxiliary cathode 6 on the cover plate 3 and electrically connecting the auxiliary cathode 6 with the transparent cathode 2103 on the transparent display substrate 1, the voltage drop across the transparent cathode 2103 can be reduced.

The embodiments of the disclosure provide a transparent display substrate, a manufacturing method thereof, and a transparent display panel. The capacitor and the TFT driving circuit in the driving circuit for driving OLED to emit light are respectively arranged in two separate regions, and the region where the capacitor is positioned is transparent, namely the capacitor is arranged in a first transparent region, in this way, when the transparent display substrate is applied to the transparent display panel, the proportion of the transparent region can be increased on the basis of not affecting the display, and the transparency of the transparent display panel can be increased.

In this article, the following statements should be noted:

(1) The accompanying drawings involve only the structure(s) in connection with the embodiment(s) of the present disclosure, and other structure(s) can be referred to common design(s).

(2) For the sake of clarity, in the drawings used to describe embodiments of the present disclosure, the thickness of layers or regions is enlarged or reduced, i.e., these drawings are not drawn to actual scale.

(3) In case of no conflict, the embodiments of the present disclosure and the features in the embodiments can be combined with each other to obtain new embodiments.

What is described above is related to the illustrative embodiments of the disclosure only and not limitative to the scope of the disclosure; the scopes of the disclosure are defined by the accompanying claims.

What is claimed is:

1. A transparent display substrate comprising:
a base substrate;
a plurality of sub-pixels, arranged on the base substrate, each of the plurality of the sub-pixels comprising a light emitting region and a first transparent region, and the light emitting region being provided with an organic light emitting diode (OLED); and
a driving circuit, located in each of the plurality of the sub-pixels and configured to drive the OLED to emit light, the driving circuit comprising a capacitor disposed in the first transparent region,
wherein each of the plurality of the sub-pixels further comprises a second transparent region, the second transparent region is disposed on a side of the first transparent region away from the light emitting region; and
wherein the OLED comprises a reflective anode, an organic material functional layer, and a transparent cathode; the organic material functional layer and the transparent cathode cover an entire area of each of the plurality of the sub-pixels, and in the second transparent area, the organic material functional layer is in direct contact with the base substrate.

2. The transparent display substrate according to claim 1, wherein the first transparent region is configured to space apart the light emitting region and the second transparent region from each other.

3. The transparent display substrate according to claim 2, wherein a sum of thicknesses of all film layers on the base substrate in the second transparent region is smaller than a sum of thicknesses of all film layers on the base substrate in the first transparent region.

4. The transparent display substrate according to claim 1, wherein the driving circuit further comprises a drive thin film transistor (TFT) located in the light emitting region, the drive TFT comprises a first active layer, the capacitor comprises a first electrode, the first active layer is located in the light emitting region and configured to extend to the first transparent region to serve as the first electrode of the capacitor.

5. The transparent display substrate according to claim 4, wherein the driving TFT further comprises a first gate electrode, the capacitor further comprises a second electrode, the second electrode of the capacitor is a transparent electrode, and the second electrode is electrically connected with the first gate electrode.

6. The transparent display substrate according to claim 5, wherein the driving circuit further comprises a switching TFT located in the light emitting region, the switching TFT comprises a second gate electrode, a second active layer, a second source electrode, and a second drain electrode, the second drain electrode is electrically connected to the second electrode of the capacitor.

7. The transparent display substrate according to claim 5, wherein, in the first transparent region, the first electrode and the second electrode of the capacitor are isolated from each other by an interlayer insulating layer.

8. The transparent display substrate according to claim 1, wherein the base substrate comprises a substrate body and a buffer layer disposed on the substrate body.

9. A transparent display panel comprising the transparent display substrate according to claim 1.

10. The transparent display panel according to claim 9, further comprising an opposed substrate opposed to the transparent display substrate, wherein the opposed substrate comprises a color filter layer and a black matrix; the color filter layer and the black matrix are disposed in regions corresponding to light emitting regions on the transparent display substrate.

11. The transparent display panel according to claim 10, wherein the opposed substrate further comprises an auxiliary cathode, the auxiliary cathode is electrically connected to the transparent cathode on the transparent display substrate; an orthographic projection of the auxiliary cathode on the base substrate is located in an orthographic projection of the black matrix on the base substrate.

12. A method for manufacturing a transparent display substrate, comprising:
providing a base substrate;
forming a plurality of sub-pixels on the substrate, each of the plurality of sub-pixels comprising a light emitting region, a first transparent region and a second transparent region, an organic light emitting diode (OLED) being formed in the light emitting region, and the second transparent region being disposed on a side of the first transparent region away from the light emitting region, wherein the OLED comprises a reflective anode, an organic material functional layer, and a transparent cathode; the organic material functional layer and the transparent cathode cover an entire area of each of the plurality of the sub-pixels, and in the second transparent area, the organic material functional layer is in direct contact with the base substrate; and
forming a driving circuit in each of the plurality of the sub-pixels, the driving circuit being configured to drive the OLED to emit light and comprising a capacitor formed in the first transparent region.

13. The method according to claim 12, wherein the first transparent region is configured to space apart the light emitting region and the second transparent region from each other.

14. The method according to claim 12, wherein the forming the driving circuit in each of the plurality of the sub-pixels further comprises:
forming a driving thin film transistor (TFT) in the light emitting region of each of the plurality of the sub-pixels, wherein the driving TFT comprises a first active layer, the capacitor comprises a first electrode, the first active layer is located in the light emitting region and is configured to extend to the first transparent region, and the first active layer is further configured to serve as the first electrode of the capacitor after the first active layer being electrically conductive.

15. The method according to claim 14, wherein the driving TFT further comprises a first gate electrode, the capacitor further comprises a second electrode, the second electrode of the capacitor is a transparent electrode, and the second electrode is electrically connected with the first gate electrode.

16. The method according to claim 15, wherein the forming the driving circuit in each of the plurality of the sub-pixels further comprises: forming a switching TFT in the light emitting region of each of the plurality of the sub-pixels, the switching TFT comprises a second gate electrode, a second active layer, a second source electrode, and a second drain electrode, the second drain electrode is electrically connected to the second electrode of the capacitor.

17. The method according to claim 15, wherein in the first transparent region, a first electrode and a second electrode of the capacitor are isolated from each other by an interlayer insulating layer.

* * * * *